(12) United States Patent
Kawamata et al.

(10) Patent No.: US 7,016,214 B2
(45) Date of Patent: Mar. 21, 2006

(54) SEMICONDUCTOR INTEGRATED CIRCUIT DEVICE

(75) Inventors: Tsuneo Kawamata, Tokyo (JP);
Masatoshi Hasegawa, Tokyo (JP);
Keinosuke Toriyama, Hitachinaka (JP);
Tomofumi Hokari, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/957,712

(22) Filed: Oct. 5, 2004

(65) Prior Publication Data
US 2005/0077582 A1    Apr. 14, 2005

(30) Foreign Application Priority Data
Oct. 6, 2003  (JP)  ............................. 2003-346500

(51) Int. Cl.
*G11C 5/06* (2006.01)
(52) U.S. Cl. .................. 365/63; 365/230.06; 257/369; 257/401
(58) Field of Classification Search .................. 365/63, 365/214, 230.06, 230.08; 257/369, 401
See application file for complete search history.

(56) References Cited

U.S. PATENT DOCUMENTS

| | | | | |
|---|---|---|---|---|
| 5,418,387 A | * | 5/1995 | Nakamura et al. | 257/231 |
| 5,572,480 A | * | 11/1996 | Ikeda et al. | 365/230.06 |
| 6,236,258 B1 | | 5/2001 | Hoenigschmid et al. | 327/534 |
| 6,448,596 B1 | * | 9/2002 | Kawajiri et al. | 257/292 |
| 2003/0183860 A1 | * | 10/2003 | Uchiyama et al. | 257/296 |

FOREIGN PATENT DOCUMENTS

JP          10-050957          8/1996

* cited by examiner

*Primary Examiner*—Gene N. Auduong
(74) *Attorney, Agent, or Firm*—Mattingly, Stanger, Malur & Brundidge, P.C.

(57) ABSTRACT

A semiconductor integrated circuit device capable of achieving higher integration and simplification of manufacturing processes is provided. Circuitry is provided which includes a first N-channel MOSFET and a first p-channel MOSFET each having a gate insulating dielectric film with a first film thickness, wherein a poly-silicon layer making up a gate electrode is doped with an N-type impurity. The circuitry also includes a second N-channel MOSFET having a gate insulator film with a second film thickness thinner than the first thickness, wherein an N-type impurity is doped into a polysilicon layer making up a gate electrode, and a second P-channel MOSFET with a P-type impurity being doped into a polysilicon layer making up a gate electrode. The gate electrodes of the first N-channel MOSFET and first P-channel MOSFET are integrally formed and mutually connected together.

10 Claims, 14 Drawing Sheets

SEMICONDUCTOR INTEGRATED CIRCUIT DEVICE

INCORPORATION BY REFERENCE

The present application claims priority from Japanese application JP2003-346500 filed on Oct. 6, 2003, the content of which is hereby incorporated by reference into this application.

1. Field of the Invention

The present invention relates to semiconductor integrated circuit devices and also relates to effective techniques for use with element layout architectures of sub-word drivers of hierarchical word-line schemes of dynamic random access memories (DRAMs) by way of example.

BACKGROUND OF THE INVENTION

An example of DRAMs capable of shrinking the area of word-line driver circuitry by use of P-channel MOSFETs of the so-called ring type is disclosed in U.S. Pat. No. 6,236,258B1. In addition, an example that employs ring-shaped gate electrodes to accomplish breakdown voltage enhancement is found in JP-A-10-050957.

In the devices as taught by the above-identified Japanese patent documents, each is such that the ring-shaped gate MOSFETs are applied to word drivers and sub-word drivers. These documents fail to teach or suggest guidelines as to the sizes of the ring-shaped gates and methodology for reducing deviations of parasitic resistance components. More principally, the documents are completely silent about exact applicability to CMOS technologies. In short, the ring-shaped gates as taught thereby are mere examples to be applied only to N-channel MOSFETs or P-channel MOSFETs. CMOS devices are the ones that make up a circuit by using an N-channel MOSFET and a P-channel MOSFET as a pair. In this respect, it becomes important to provide efficient layout while at the same time maintaining the circuit relationship of the both.

SUMMARY OF THE INVENTION

In cases where P-channel and N-channel MOSFETs are designed to have a CMOS configuration, if these are the same in size as each other, then the N-channel MOSFET becomes approximately two times greater in conductance than the P-channel MOSFET. Accordingly, when designing the CMOS configuration at the same size, its logic threshold is shifted or "offset" to its low level side, resulting in a significant decrease in low-level side margin of an input signal. Thus it becomes necessary for achievement of the CMOS configuration to make use of special techniques while employing the above-noted ring-shaped gate MOSFETs. Nevertheless, the above-noted patent documents lack any teachings as to this point. Furthermore, in the process of consideration of circuit layout designs in the case of using MOSFETs with ring-shaped gates, it has been found that the layout of source/drain contacts and gate draw-out portions results in differences in source-drain resistance (parasitic resistance) components, which in turn causes the MOSFETs to vary or deviate in operation characteristics. Note here that the gate draw-out portions are gate wiring lines or leads that extend from the ring-shaped gates toward the outside of source/drain regions, which gate leads are portions used for electrical interconnection with neighboring ring gates and for layout of gate contacts.

An object of this invention is to provide a semiconductor integrated circuit device capable of achieving higher integration and enhanced operation stability. This and other objects, features and advantages of the invention will be apparent from the following description of the specification and the accompanying drawings.

Below is a brief explanation of the summary of a representative one of the principles of the invention as disclosed herein. A semiconductor integrated circuit device includes a plurality of first circuits each being such that the gate of a MOSFET of first conductivity type and the gate of a MOSFET of second conductivity type are commonly connected together for use as a first input terminal, the source of the first conductivity type MOSFET is for use as a second input terminal, the ground potential of circuitry is given to the source of the second conductivity type MOSFET, and the drain of first conductivity type MOSFET and a drain of the second conductivity type MOSFET are common-coupled together for use as an output terminal. The first conductivity type MOSFET is arranged so that a single gate electrode has a rectangular shape, whereas the second conductivity type MOSFET is such that two adjacent gate electrodes exhibit a rectangular shape in combination while letting these rectangular gate electrodes be put in place so that their pitches are equal in value to each other. First input terminals of the plurality of first circuits are connected together by a wiring layer which makes up the gate electrodes.

It is possible to lessen the occupation area of CMOS circuitry having rectangular gates. It is also possible to suppress relative deviation of operation characteristics of a plurality of CMOS circuits. It becomes possible for the CMOS circuits to offer well-stabilized operability.

Other objects, features and advantages of the invention will become apparent from the following description of the embodiments of the invention taken in conjunction with the accompanying drawings.

DETAILED DESCRIPTION OF THE INVENTION

Figure 1:
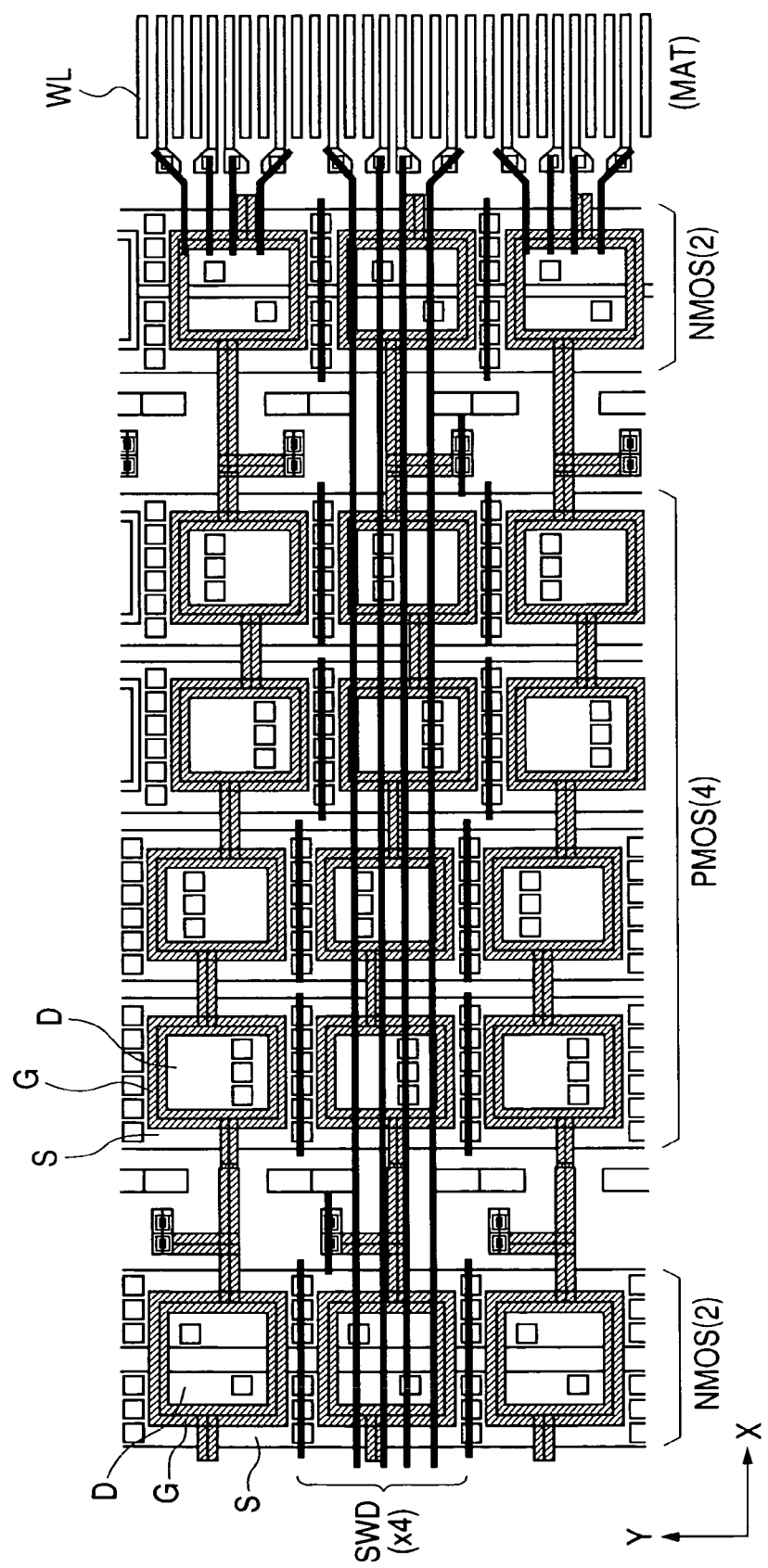
FIG. 1 is a layout diagram showing one embodiment of a sub-word driver in accordance with this invention.

Referring to FIG. 1, there is shown a layout diagram of one embodiment of a sub-word driver unit in accordance with this invention. In this embodiment, MOSFETs making up four sub-word drivers corresponding to four sub-word lines WL are formed so that these are arrayed in a word-line direction (X direction in FIG. 1). The subword drivers SWD are such that each is operable to drive subword lines WL which are provided in two memory mats (sub-arrays) that are formed to put it therebetween, as will be described later. There are exemplarily shown in FIG. 1 those subwordlines WL that are provided in one of the two memory mats, which is located on one end side in the X direction.

In a chip surface area in which the above-noted four subword drivers SWD (x4) are formed, a total of eight subwordlines WL are allocated. Since a respective one of the subword drivers is the one that drives the subwordlines WL of two memory mats that interpose it therebetween as stated previously, when looking at from the memory mat side, a select operation of a subwordline WL is performed by two subword drivers that interpose it between them. To make a long story short, the eight subwordlines WL are driven in a way which follows: the half, i.e., four subwordlines WL, is driven by four subword drivers SWD which are arranged on one end side in the X direction of the memory mat; the remaining half, i.e., the other four subwordlines WL, is driven by four subword drivers that are laid out at the other end side of the memory mat (MAT).

In this embodiment, the gates G of P-channel MOSFETs (PMOS) and N-channel MOSFETs (NMOS) which make up subword drivers are formed to have rectangular ring-like shapes as indicated by hatching in FIG. 1. In this drawing, four P-channel MOSFETs (PMOS) are formed at a central portion; on the both sides (memory mat sides) thereof, two and two N-channel MOSFETs (NMOS) are formed respectively. It should be noted here that unlike the P-channel MOSFETs, the gates of N-channel MOSFETs are such that two MOSFET gates are provided, each of which is designed into a rectangular shape. In other words, the gates of two MOSFETs are formed to have a rectangular ring-like shape. At its central portion, active regions that form the source and drain (S, D) are separated from each other by an isolation area. Whereby, the shape of the gate making up one MOSFET is formed into a square bracket ("]")-like shape, which is definable by subdividing a rectangle into two parts and which resembles a Japanese katakana letter "ko."

N-channel MOSFETs are about two times greater in conductance characteristics than P-channel MOSFETs, if the gate length is the same. Thus, by setting the gate length of N-channel MOSFETs to the half of that of P-channel MOSFETs as stated above, P-channel MOSFETs become almost equal in conductance to N-channel MOSFETs in cases where P- and N-channel MOSFETs are series-connected together to thereby constitute CMOS inverter circuitry. Thus it is possible to set the logic threshold voltage at about the half (½) of an operating voltage. This in turn makes it possible to permit the level margin of an input signal to stay equal in high and low levels thereof.

In this embodiment, the above-noted four P-channel MOSFETs and two plus two N-channel MOSFETs on the both sides thereof are combined together to constitute four CMOS inverter circuits for use as four subword drivers. Each CMOS inverter circuit is such that the gates of P- and N-channel MOSFETs are common-coupled together. In this embodiment, input signals of four CMOS inverter circuits are coupled as a first input terminal to a main wordline. Owing to this configuration, the gates of the four P-channel MOSFETs and those of the four N-channel MOSFETs are common-coupled together. This connection line is integrally formed with gate electrodes by the same wiring layer as the gate electrodes.

Although not specifically limited, connection nodes with the main wordline are formed on or above a well isolation area for separation between an N-type well region in which the P-channel MOSFETs are formed and a P-type well region in which the N-channel MOSFETs are formed. As wo and two N-channel MOSFETs are respectively formed on the both sides of a group of four P-channel MOSFETs as described above, two well isolation areas are required. Hence, two connection nodes are provided for connection with the main wordline. The P-type well region in which the N-channel MOSFETs are formed is made common or "commonized" with a P-type well region in which N-channel MOSFETs for the memory cell address selection use are formed. With such an arrangement, it is possible to fabricate both the N-channel MOSFETs of subword drivers and the N-channel MOSFETs of memory cells in the same P-type well region, which may contribute to achievement of higher integration.

In FIG. 1, four heavy straight line segments extending in the X direction represent subword output lines. More specifically, one subword output line serves as a wiring line that connects the drains of a pair of P- and N-channel MOSFETs making up a subword driver and also performs interconnection with a corresponding subword line WL. In FIG. 1, four subword output lines corresponding to the centrally provided subword drivers are exemplarily shown as representative ones for purposes of facilitating the understanding of a layout pattern of circuit elements. The subword output lines are eliminated from the illustration in regard to those groups each having four subword drivers, which are disposed on the both sides in the Y direction in such a manner as to interpose therebetween the exemplarily shown four subword output lines.

The above-noted MOSFETs with rectangular ring-shaped gates are such that the inside of a rectangular ring is for use as a drain region whereas the outside of it is used as a source region. P-channel MOSFETs of different sets as arrayed in the Y direction are arranged so that electrical contacts are formed in common with the sources S of their neighboring sets to permit the sources of P-channel MOSFETs that are lined up in the Y direction to be connected to subword select lines (FX lines). At this time, when looking at one P-channel MOSFET, six and six contacts that are aligned in the X direction are provided on the both sides in the Y direction in such a way that opposite contacts interpose a rectangular ring-shaped gate therebetween. Adversely, when viewing from the ensemble of six contacts arrayed in the X direction, they serve to connect the sources S of two P-channel MOSFETs putting it therebetween to a subword select line. The sources S of N-channel MOSFETs are given ground potential VSS of the circuitry. Accordingly, three contacts for use with the sources of N-channel MOSFETs are such that two of them lined up in the X direction are common-coupled together.

Figure 2:
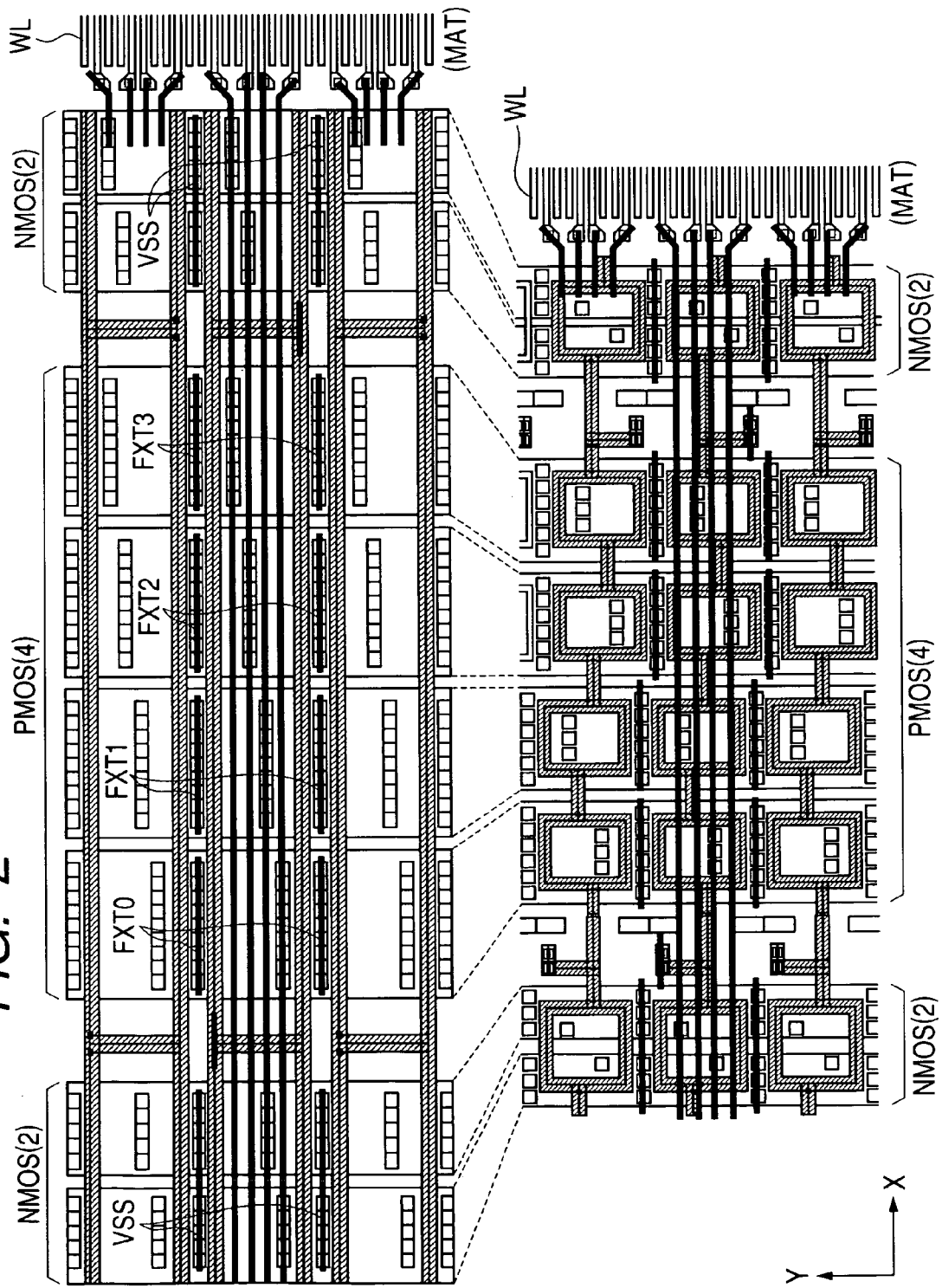
FIG. 2 is a layout diagram for explanation of this invention.

A layout diagram for explanation of this invention is shown in FIG. 2. In FIG. 2, there are shown for comparison purposes an example of circuitry including subword drivers configured from MOSFETs having straight-line gates, which have been studied prior to conceiving the invention as disclosed herein, and a circuit configuration of the subword drivers of the FIG. 1 embodiment with the same size settings. The straight-gate MOSFETs are arranged so that two gates are laid out in parallel to the X direction. In other words, two MOSFETs are designed to have a parallel form to thereby obtain a large conductance value while using short lengths in the X direction.

In the case of using such straight-gate MOSFETs as shown in FIG. 2, two MOSFETs are set in the parallel form so that the X-directional length of an active region of MOSFET can be reduced to one half (½) of the size of a gate width Wg required. By contrast, in the case of rectangular ring-shaped gates as in the FIG. 1 embodiment, the ring inside is designed as a drain whereas the ring outside is as a source so that the ring's circumferential length becomes equal to the gate width Wg, allowing the Y-directional length of the ring also to function as a gate. Thus it is possible to further shorten the X-directional length of active region accordingly. Since the Y-directional length of a subword driver is determinable depending upon the layout pitch of word lines (WL), the subword drivers using the ring-shaped gate MOSFETs capable of shortening the length in the X direction as in the embodiment of this invention offers an ability to make the on-chip layout area smaller than that of the straight-gate subword drivers of FIG. 2. In this connection, it is possible for the example of FIG. 2 to realize demonstrable area reduction of about 30%.

Although MOSFETs with a large gate width Wg are such that a ring is formable by the gate of a single MOSFET, MOSFETs with a small gate width Wg are incapable, in some cases, of being formed to have the intended ring-like shapes due to the presence of constraint of on-chip layout rules. Consequently, regarding N-channel MOSFETs with small gate width Wg, the gates of two elements are used to form a single ring. In this case, the resulting gate exhibits a square bracket ("]")-like shape as far as a single MOSFET is concerned. In the embodiment of FIG. 1, P-channel MOSFETs with large gate width Wg are arranged to have rectangular ring-shaped gates, while N-channel MOSFETs with small gate width Wg are designed to have "]"-shaped gates.

Figure 3:
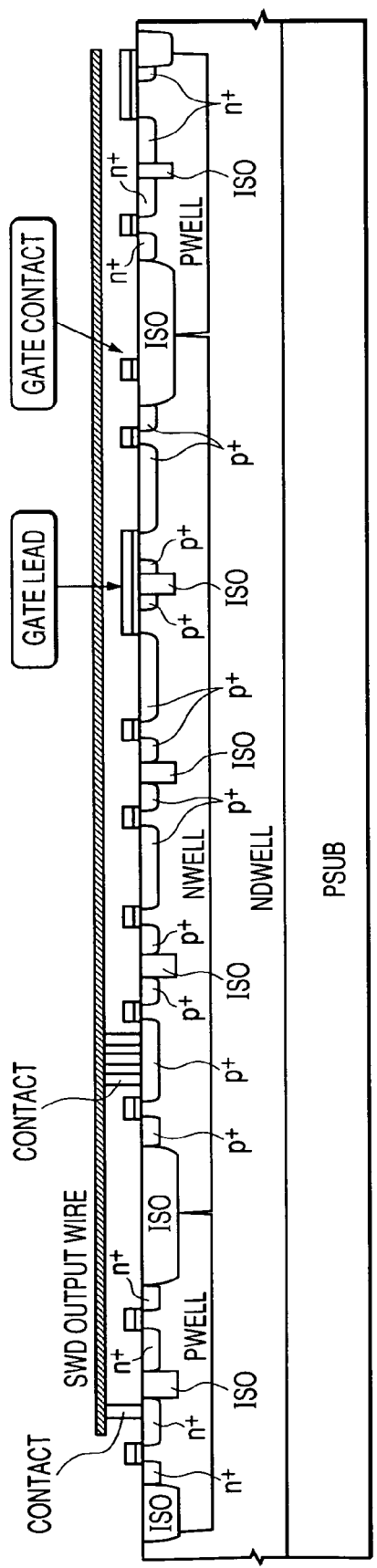
FIG. 3 is an element cross-section diagram showing one embodiment of a subword driver unit in accordance with the invention.

Turning to FIG. 3, there is shown a cross-sectional view of the device which includes the subword drivers in accordance with one embodiment of this invention. The illustration shown herein is a sectional view of a device structure with regard to certain one of the four subword output lines shown in FIG. 1—that is, the penultimate output line that is next to the lowermost one. Although not specifically limited, the SWD output lines are constituted from metal wiring lines at a first layer level, which are connected by contact conductors to the drains of N-channel MOSFETs that are provided at the left end of a chip. Additionally, electrical connection is made by contacts to the drains of those of the four P-channel MOSFETs which are provided at the left end.

An N well NWELL is provided at a central portion of the subword driver unit in the X direction of FIG. 1, in which four P-channel MOSFETs are provided. These P-channel MOSFETs are arranged so that a heavily-doped P (P+) type diffusion layer with its size enlarged in the X direction is used as a drain, wherein sources formed of p+ diffusion layers are provided on the both sides thereof with a gate electrode interposed therebetween. The gates and sources are each formed to have a rectangular ring-like shape. The sources and drains shown in FIG. 3 are such that two are integrally arranged. In this drawing, gate draw-out portions of the gates of two MOSFETs on the right side are simply extended and then connected to each other. These gate draw-out portions, also known as gate leads, are formed to overlie an isolation area ISO, which is for mutual separation between P-channel MOSFETs.

Above well isolation areas ISO for separation between the above-noted N well NWELL in which P-channel MOSFETs are formed and P well region PWELL on its both sides in each of which two N-channel MOSFETs are formed, the gates of the four P-channel MOSFETs and N-channel MOSFETs and gate contacts for connection of main word lines (not shown) are provided. As previously stated, the isolation areas ISO each of which is for separation between the N well region NWELL and P well regions PWELL are provided on the both sides of N well region NWELL, respectively. In this respect, the contacts for performing connection with a main word line(s) are provided at two portions although only one of them is shown in the drawing for illustration purposes only. In this embodiment, the efficiency of chip surface area usage is increased by letting the gate contacts of subword drivers be laid out above the isolation areas ISO, in which no device elements can be formed.

It should be noted that the P wells PWELL and N wells NWELL are formed in a deep N-well region NDWELL. This well NDWELL is formed in a P-type semiconductor substrate PSUB. With such the triple well structure, element isolation is performed. In addition, the isolation area ISO for separation of N-channel active regions and the well isolation area ISO are comprised of silicon oxide layers.

Figure 4A:
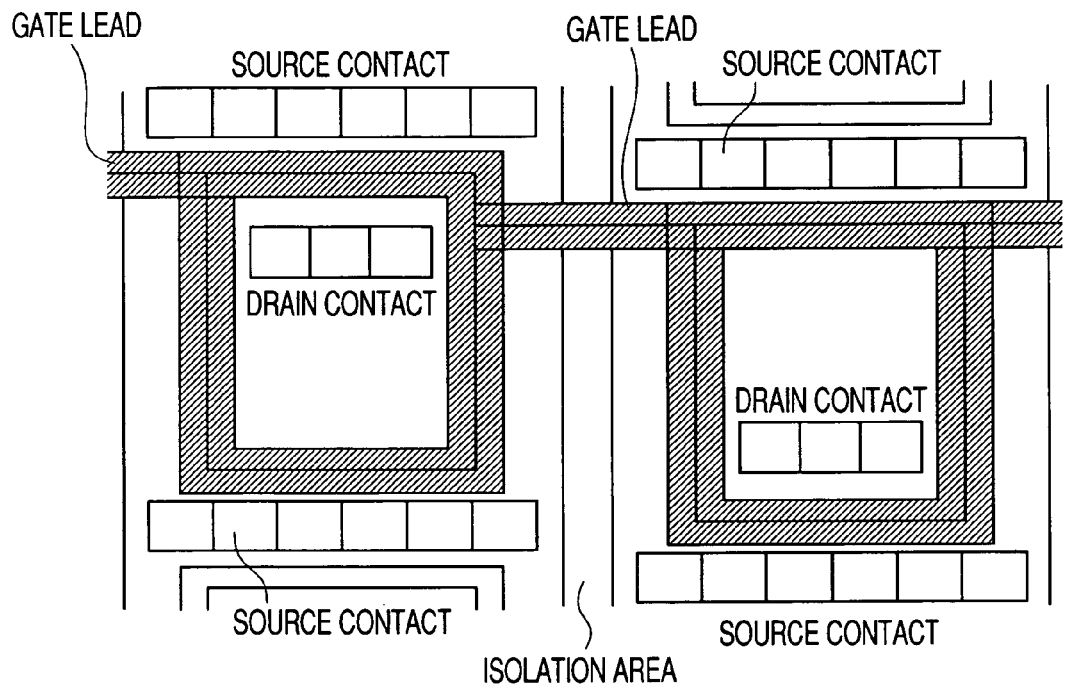
FIGS. 4A and 4B are layout diagrams each being for explanation of a mutual connection relationship of MOSFETs having ring-shaped gates in accordance with the invention.
Figure 4B:
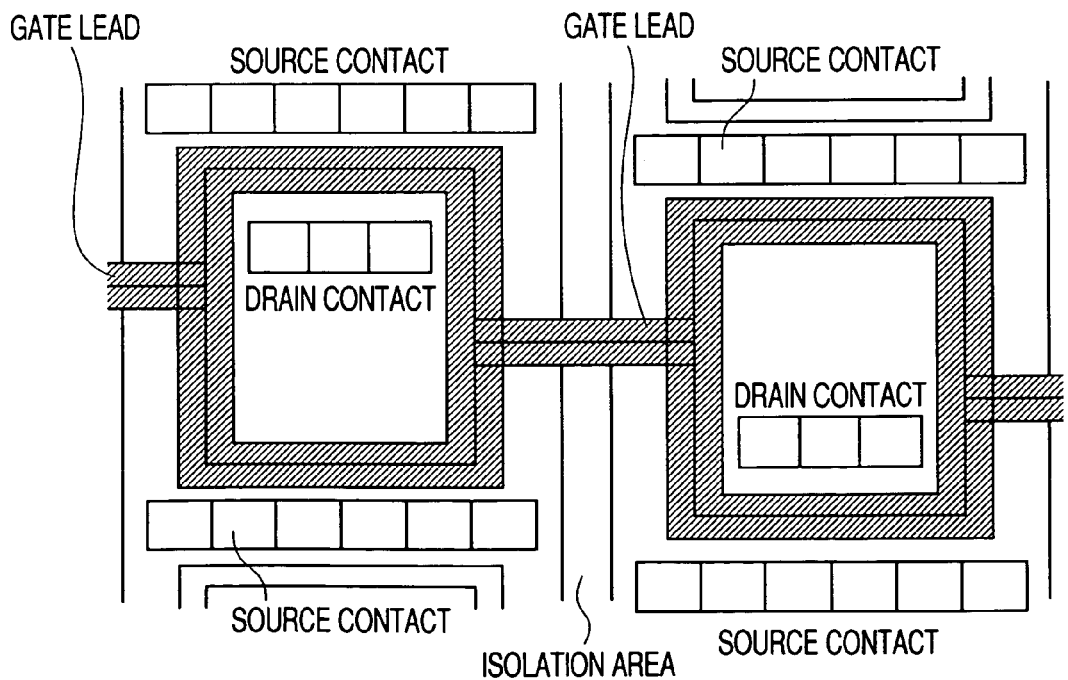
Figure 5A:
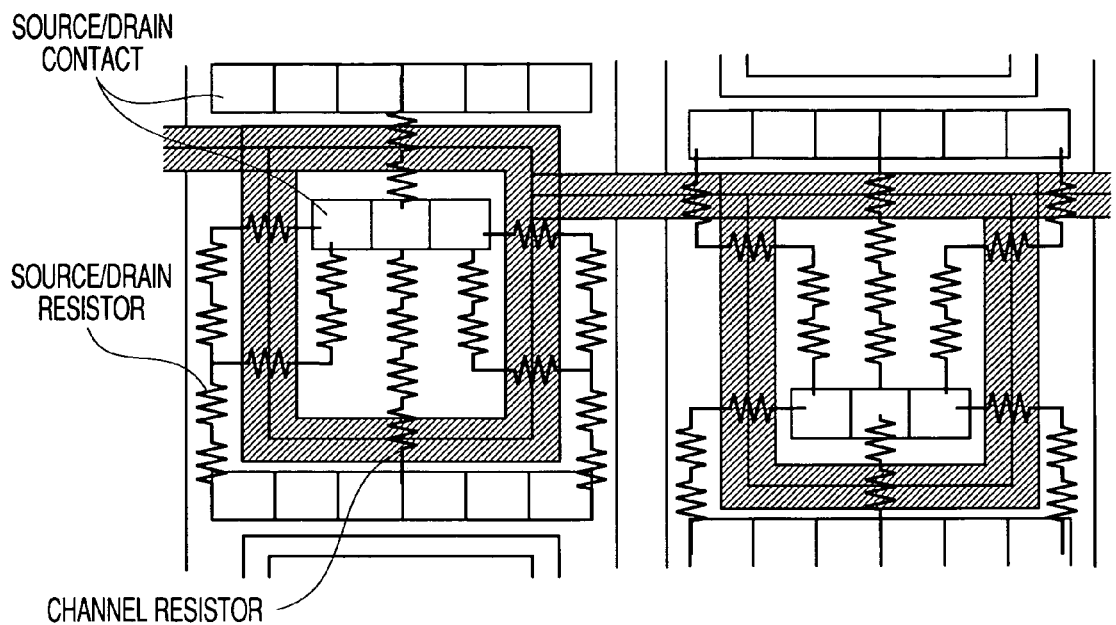
FIGS. 5A and 5B are explanation diagrams of parasitic resistance components of the layout arrangements of FIGS. 4A–4B.

See FIGS. 4A and 4B, which are diagrams each showing a layout pattern for explanation of the mutual connection relationship of MOSFETs having rectangular ring-shaped gates in accordance with this invention. It has been found by the inventor(s) of this invention that the source/drain regions can significantly vary in resistance in a way depending on the layout and shapes of ring-shaped gates and source/drain contacts. For example, as for the one that the gate draw-out positions become asymmetrical when mutually connecting the gates of two MOSFETs as shown in FIG. 4A, the parasitic resistance components shown in FIG. 5A differ in value unintentionally. Although the channel resistance between a drain contact and a source contact can be made equal by letting the contact relationship be symmetrical for example, the source/drain resistance becomes significantly different at two MOSFETs.

Figure 5B:
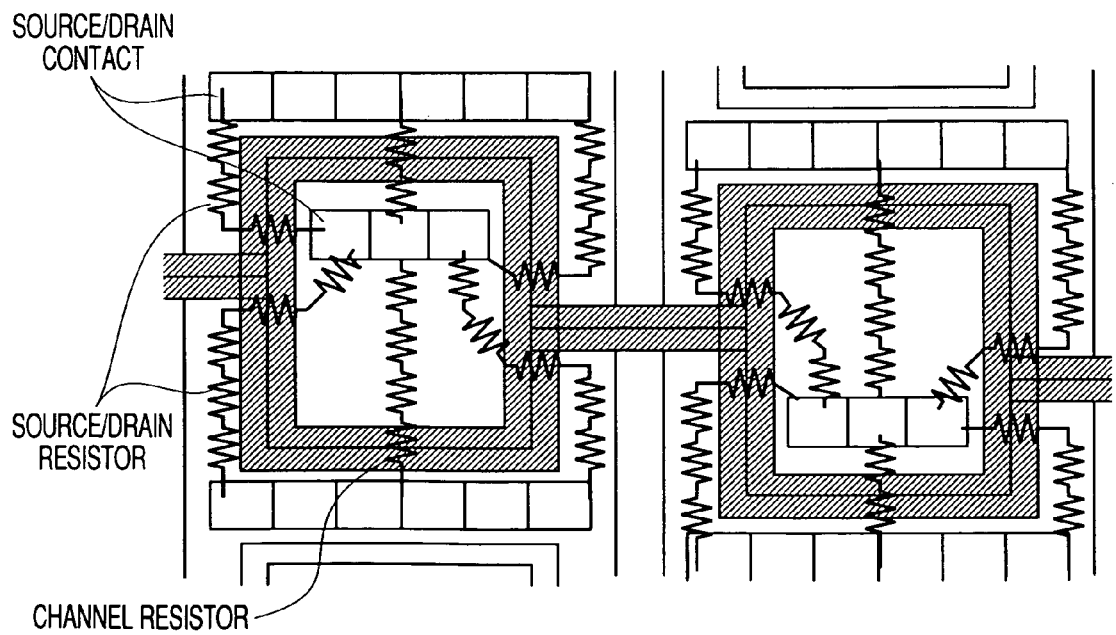

Consequently, as shown in FIG. 4B, the gate draw-out portions for mutual connection of ring-shaped gates are disposed symmetrically in relation with the positions of source/drain contacts, thereby enabling the source/drain parasitic resistances shown in FIG. 5B also to become equal to each other. More specifically, in the layout of FIG. 4B, the source/drain contacts at two MOSFETs are made symmetrical while arranging, by taking into consideration the positions of such contacts, the MOSFET provided on the left side of the drawing so that a gate draw-out portion for connection to the gate of MOSFET disposed on the left side of the drawing is shifted or "offset" toward an upward direction from the upper and lower bisecting center lines and also letting a gate draw-out portion for connection with the gate of MOSFET disposed on the right side of the drawing be offset to the downward direction from the above-noted center lines. This pattern is used as the basic, thereby arranging the MOSFET disposed on the right side of the drawing to have a pattern resulting from rotation by 180° of the above-noted MOSFET arranged on the left side.

In short, the right-side MOSFET is arranged by upward/downward inversion and then rightward/leftward inversion of the left-side MOSFET to cause the gate draw-out portions to be identical to the X direction, thereby providing the mutual connection of these MOSFETs. In the embodiment of FIG. 1, these two MOSFETs correspond to the centrally disposed two MOSFETs of the four P-channel MOSFETs. In FIG. 4, a MOSFET that is disposed on further left side is designed to have a pattern resulting from up/down and right/left inversion processes with respect to such MOSFET, as can be understood from the embodiment of FIG. 1. Similarly in FIG. 4, a MOSFET being disposed on further right side is designed to have a pattern resulting from up/down and right/left inversions with respect to such MOSFET, as can be understood from the FIG. 1 embodiment.

This arrangement is such that two right-side MOSFETs and two left-side MOSFETs are offset to each other in position along the Y direction. Using this offset makes it possible to permit those contacts provided at the drains of a pair of P- and N-channel MOSFETs to be equal in layout pitch to first wiring layers at its upper layer level which make up the subword output lines for mutual connection thereof.

Figure 6:
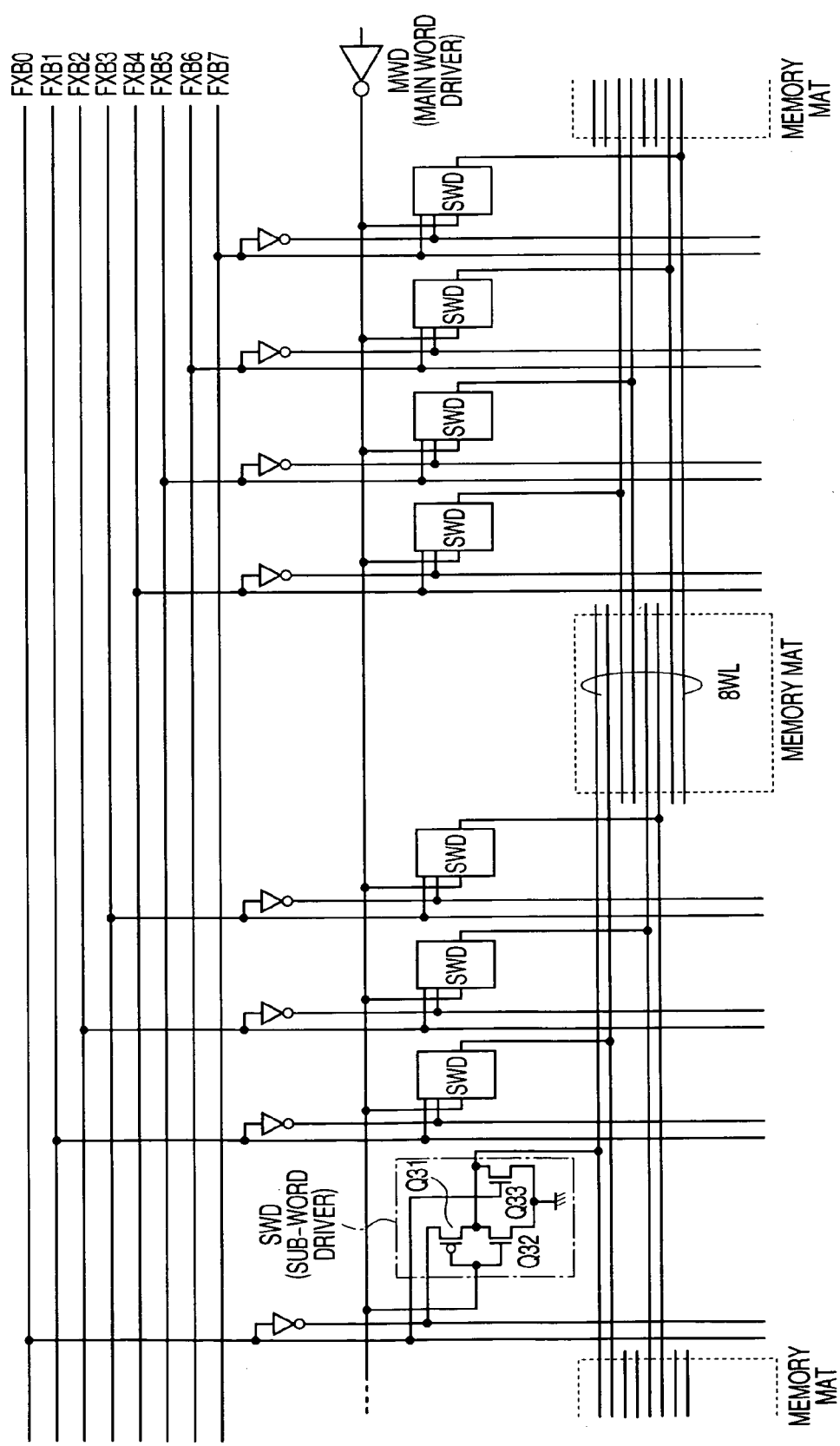
FIG. 6 is a circuit diagram for explanation of a hierarchical word structure to which this invention is applied.

In FIG. 6, a circuit diagram is shown for explanation of the hierarchical wordline structure incorporating the principles of this invention. Four and four subword drivers SWD are provided on the both sides of a memory mat, respectively. A single main word line MWL is assigned to these eight subword drivers SWD in total. The main wordline MWL is selectable by a main word driver MWD. The main wordline MWL is common-coupled to the gates of a P-channel MOSFET Q31 and N-channel MOSFET Q32, each of which makes up a group of four subword drivers SWD. The subword drivers SWD are such that an N-channel MOSFET Q33 is provided in addition to the P-channel MOSFET Q31 and N-channel MOSFET Q32, for preventing nonselected subwordlines WL from becoming in an electrical floating state.

The P-channel MOSFET Q31 has its source that is used as a second input terminal, to which a select signal is transferred from a sub-word select line FX. The subword select line is the one that selects one from among eight subwordlines WL as assigned to the above-noted one main wordline MWL and is made up of FXB0 to FXB7. Drivers are provided in a way corresponding to these subword select lines FXB0 to FXB7, each of which drivers is formed of an inverter circuit having an output line connected to the source of P-channel MOSFET Q31 of the subword driver.

The remaining seven subword drivers which are indicated by black boxes are similar in configuration, except that subword select lines connected thereto are different such as FXB1 to FXB7. When the main wordline MWL shown in FIG. 6 is set at a select level that is low in potential, the P-channel MOSFETs of eight subword drivers are set in the turn-on (ON) state. One of the eight subword select lines FXB0–FXB7—for example, line FXB0—is set in the select state of low level, the source of one P-channel MOSFET Q31 out of the eight subword drivers is set at high level, causing its corresponding subwordline WL to stay at a select level that is high in potential.

At this time, the remaining seven subword select lines FXB1–FXB7 are set at a nonselect level that is high in potential, causing the ground potential of the circuitry to be given to the source(s) of P-channel MOSFET(s). This causes the subwordline WL to become at low level, such as the ground potential of the circuitry; however, when the potential of subwordline WL reaches the threshold voltage of P-channel MOSFET, the P-channel MOSFET becomes in the turn-off (OFF) state causing subwordline WL to be undesirably set in the floating state. At this time the subword select lines FXB1–FXB7 are at high level so that a MOSFET corresponding to the N-channel MOSFET Q33 turns on, causing the nonselected subwordlines WL to be set at low level, such as the ground potential of the circuitry. At a subword driver associated with the main wordline MWL which was set at the nonselect level of low potential, a MOSFET corresponding to the N-channel MOSFET Q32 turns on, forcing the subwordline WL to be set in the nonselect state such as the ground potential of the circuitry.

Figure 7:
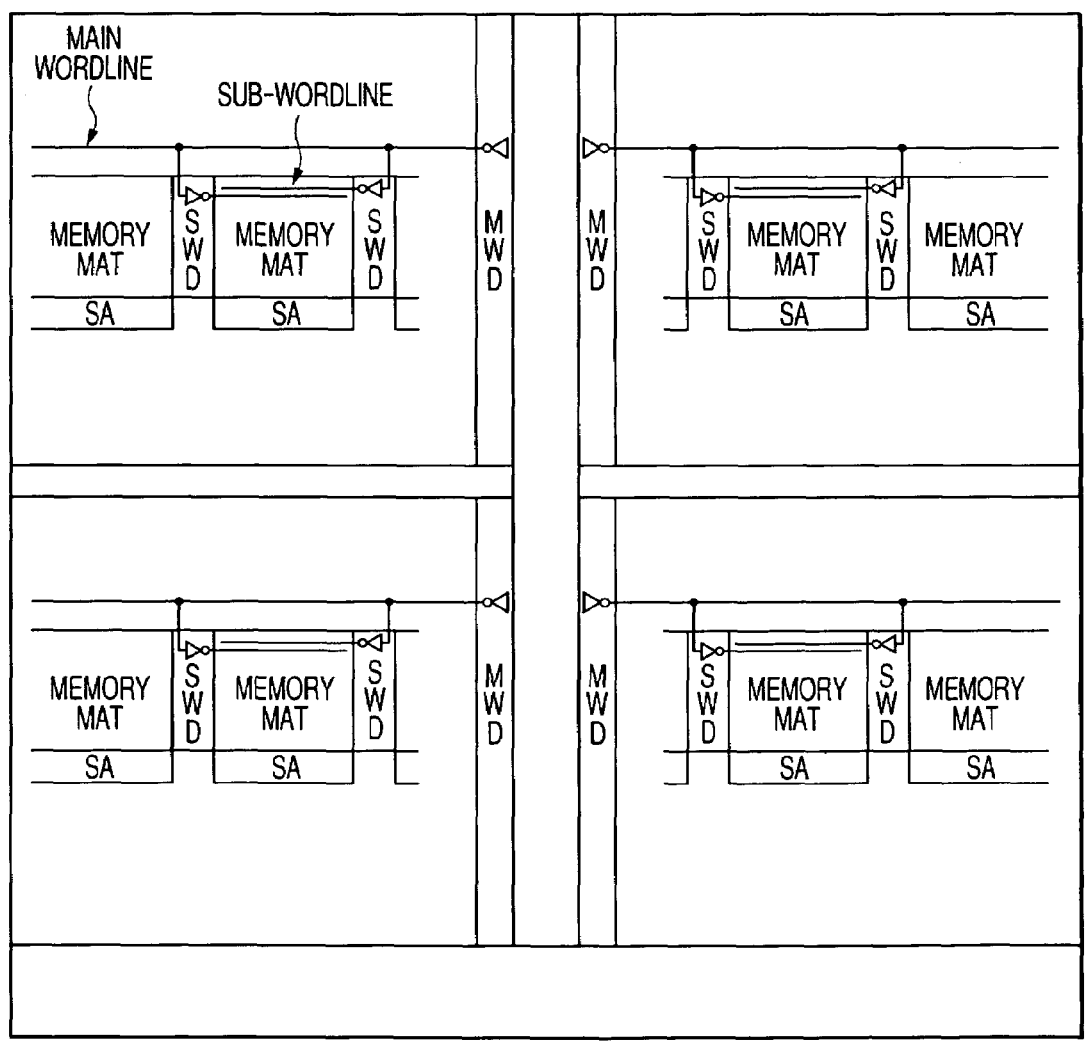
FIG. 7 is an arrangement diagram showing one embodiment of word drivers and memory mats, to which the invention is applied.

Turning to FIG. 7, a configuration diagram is shown of one embodiment including word drivers and memory mats, to which this invention is applied. In FIG. 7, in order to reduce the wordline parasitic resistance, the memory mats are segmented while activating wordlines WL using two types of drivers, i.e., subword drivers SWD and main word drivers MWD. This is a wordline structure known as the hierarchical wordline structure, a rough circuit configuration of which is as shown herein. In FIG. 7, "SA" denote sense amplifiers.

Figure 8:
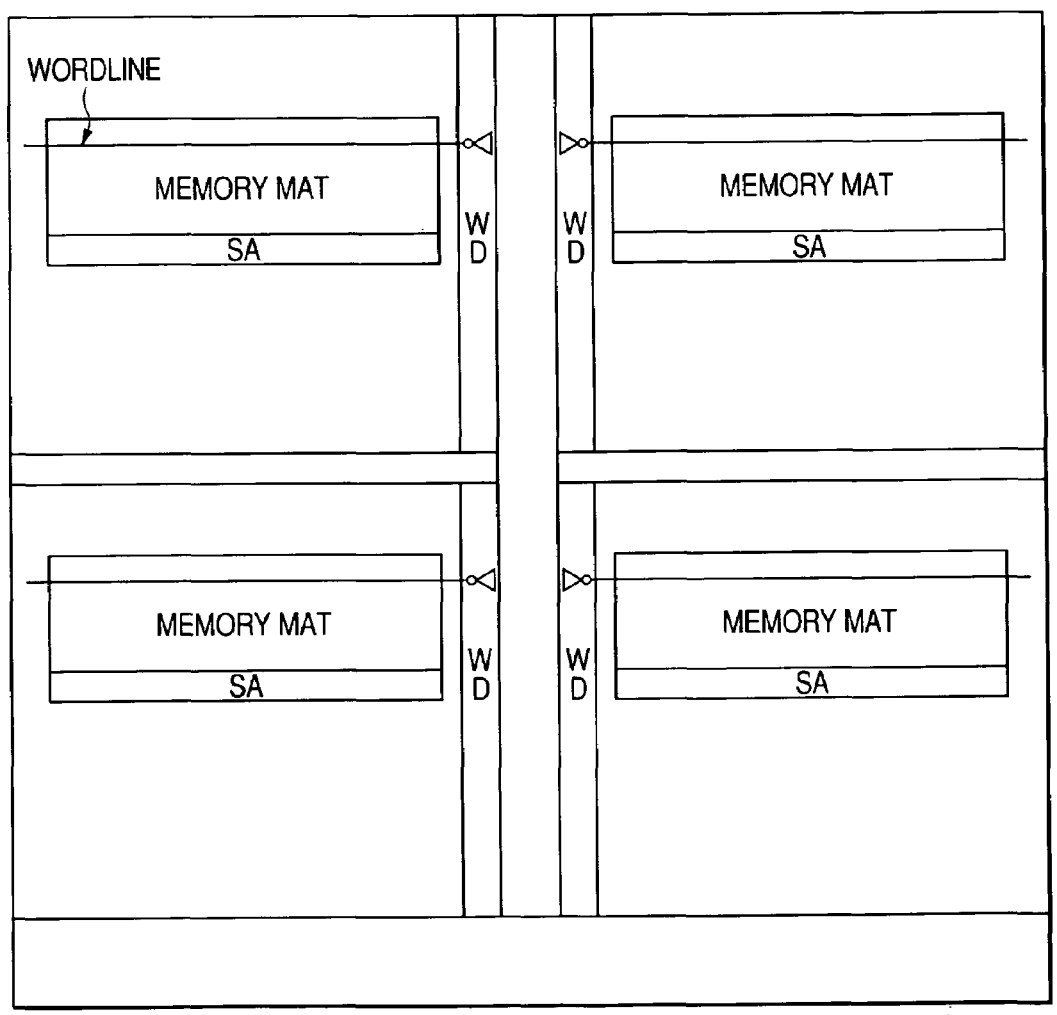
FIG. 8 is an arrangement diagram showing another embodiment of the word drivers and memory mats, to which the invention is applied.

See FIG. 8, which shows a configuration of another embodiment with word drivers and memory mats incorporating the principles of this invention. This embodiment is the one that permits word drivers WD to directly drive wordlines WL. In this case, the select address of a wordline is divided into two sets of upper and lower level bits, each of which is predecoded for supplying either one of predecoded signals to the gates—each is for use as the first input terminal—of MOSFETs making up a plurality of word drivers in a way similar to the above while supplying the other predecoded signal to the source of a P-channel MOSFET for use as a second input terminal, thereby providing the usability for enabling selection of a single wordline.

Figure 9:
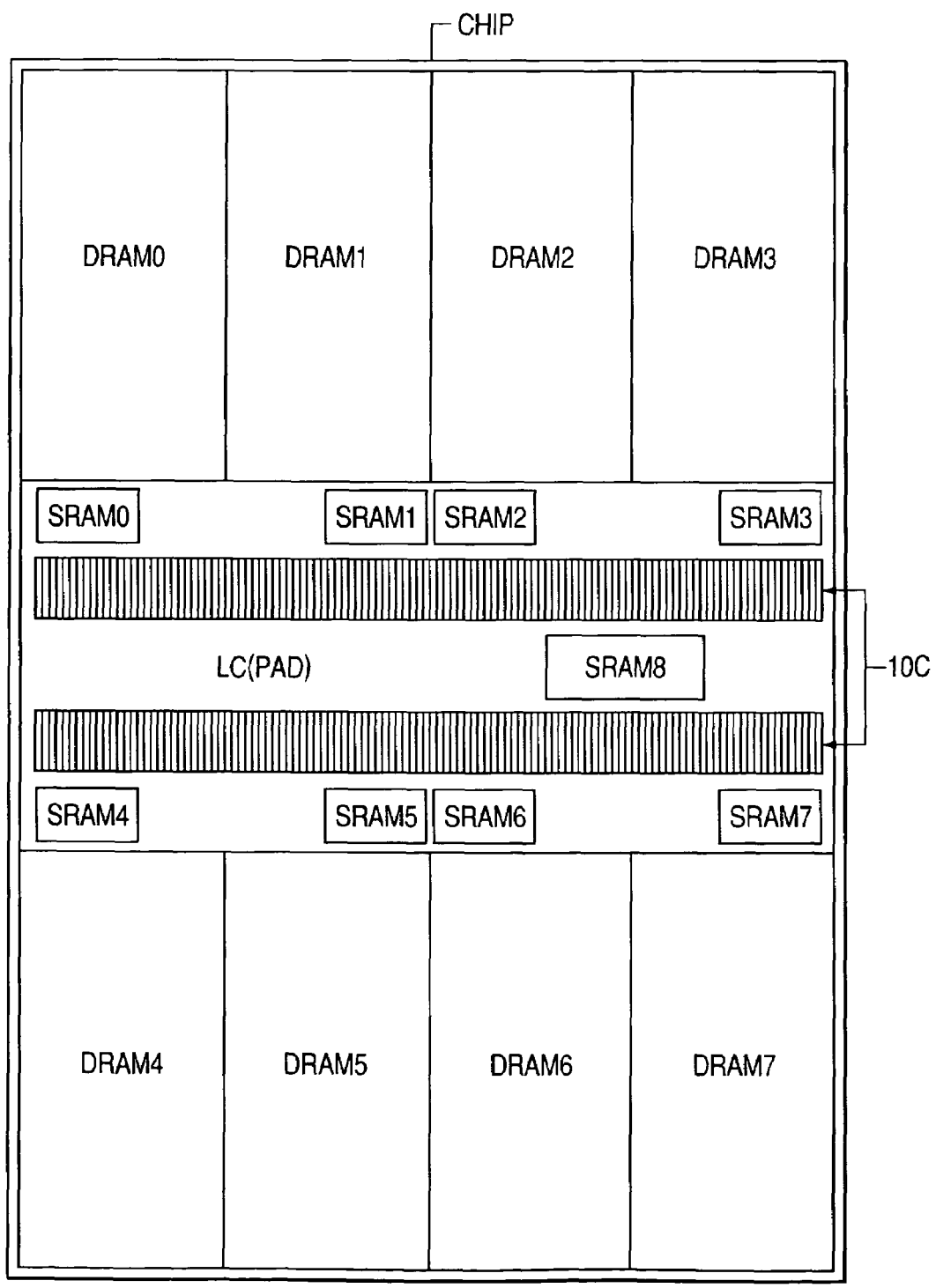
FIG. 9 is a substrate layout diagram of one embodiment of a logic-embedded memory integrated circuit to which the invention is applied.

Turning to FIG. 9, there is shown a substrate layout diagram of one embodiment of a logic/memory mixed-mount or "comount" semiconductor integrated circuit device, also known as memory-embedded logic LSI or system-on-chip (SoC) device, to which this invention is applied. The semiconductor integrated circuit device of this embodiment is formed on a single piece of semiconductor substrate by known semiconductor fabrication techniques. Although not specifically limited, the semiconductor integrated circuit device of this embodiment is mounted on a specified board of a computer system to constitute a cache memory thereof, as an example only.

In FIG. 9, the memory-embedded logic integrated circuit of this embodiment includes a total of eight memory banks which consist of four circuit blocks to be disposed on the upper edge side of a semiconductor substrate CHIP—that is, DRAM macro-cells DRAM0 to DRAM3—and four circuit blocks as disposed on the lower edge side, i.e., DRAM macrocells DRAM4–DRAM7, although the invention is not specifically limited thereto. A respective one of such memory banks (DRAM macrocells) has an address buffer (latch) to thereby enable each to offer accessibility in a way independent of the others, as will be described later.

The memory-embedded logic integrated circuit further includes eight SRAM macrocells SRAM0 to SRAM7 which are disposed within the DRAM macrocells respectively and one additional SRAM macrocell SRAM8 to be disposed at a central portion of the semiconductor substrate CHIP.

Within the SRAM macrocells SRAM0–SRAM3 and SRAM4–SRAM7, a large number of input/output cells IOC are arranged in queues along a lateral center line of the semiconductor substrate CHIP. A logic unit LC is laid out between these input/output cells IOC and SRAM macrocells, which unit includes multiple gate arrays and pads PAD corresponding to chip terminals although they are not depicted in FIG. 9. The gate arrays of the logic unit LC are combinable based on user specifications to thereby configure specified logic circuitry. Additionally the pads PAD are coupled to corresponding bumps via more than one wiring layer as formed at a package.

Input and output of data to and from the above-noted DRAM macrocells DRAM0–DRAM7 via the input/output cells IOC—that is, write and read with respect to the DRAM macrocells DRAM0–DRAM7—are carried out by way of the SRAM macrocells. Using such the intervening SRAM macrocells as a buffer makes it possible to perform data write and read operations at high speeds. The use of DRAM macrocells for data storage enables achievement of large storage capacities.

External access is done directly to SRAM8. When mishit occurs for SRAM8, access is provided to any one of SRAM0–7. If mishit still occurs then access is done to any one of DRAM0–7. In other words, SRAM8 is operable as a primary cache, SRAM0–7 operate as secondary caches, and DRAM0–7 function as tertiary caches. A control operation for performing these hit/mishit determination or the like is performed by the logic circuit LC making up a cache control circuit.

Figure 10:
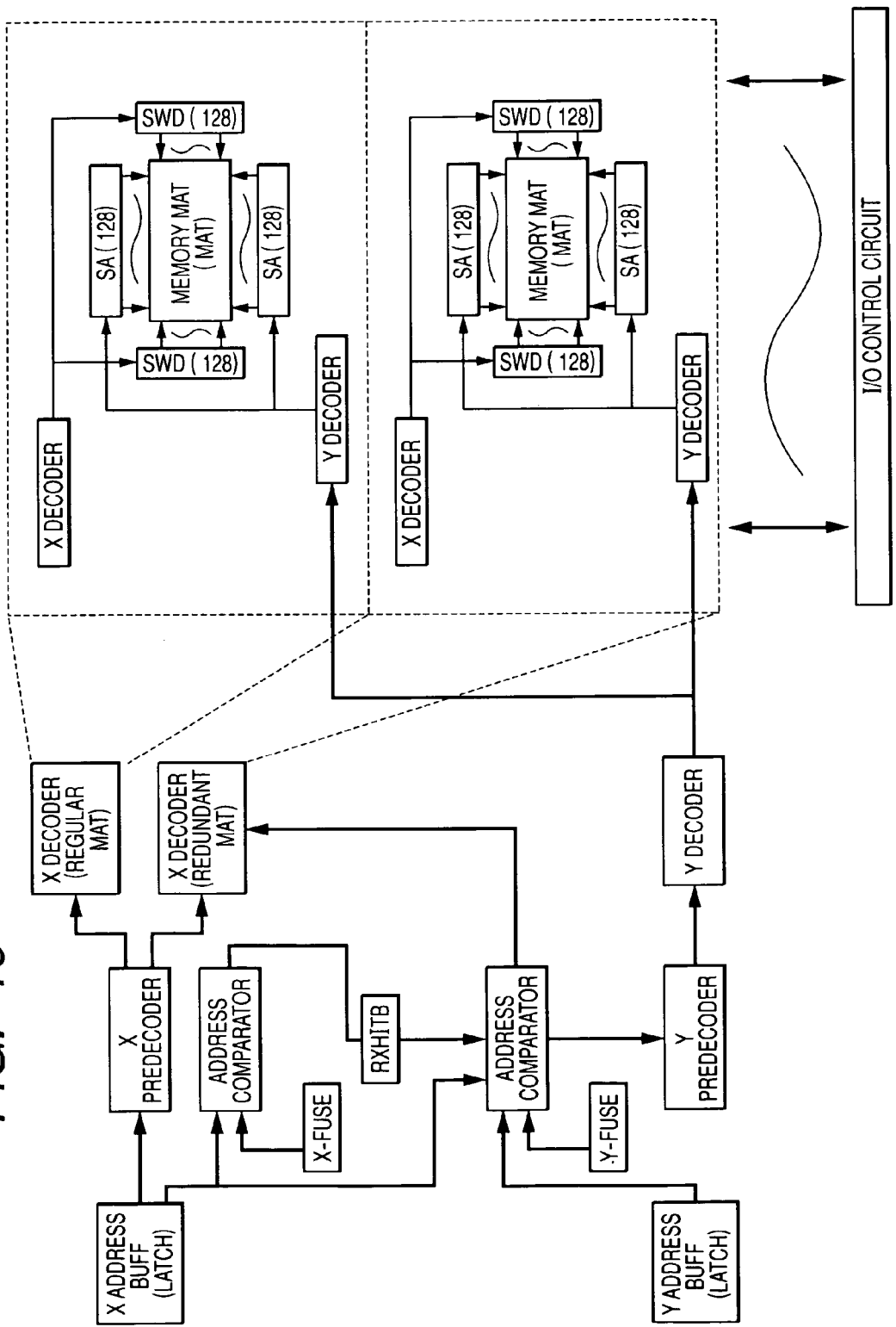
FIG. 10 is a block diagram showing one embodiment of a DRAM macrocell of FIG. 9.

Referring to FIG. 10, a block diagram of one embodiment of the above-noted DRAM macrocells (memory banks) is shown. Each memory bank has X, Y address buffers or address latches. Whereby, it is possible to supply an address to one memory bank and to continuously supply an address to a different memory bank in a way independent of a memory operation of it. More specifically, in view of the fact that DRAMs require time consumption to take out data after receipt of an input address, a technique is used for performing memory access to a plurality of memory banks in a pipeline fashion, thereby making it possible to set to virtually zero the time taken for a read operation in the individual memory bank.

In this embodiment, each memory bank is made up of a plurality of cell arrays although not specifically limited thereto. Multiple cell arrays (memory mats) are provided in the wordline and bitline directions respectively. Although not specifically limited, a cell array is arranged so that selection of a total of 256 subwordlines is performed by 128 and 128 subword drivers (SWD) which are provided at the right and left (in the wordline extending direction) of the cell array. Memory cells of the dynamic type are disposed at intersection points of the 256 subwordlines and 256 pairs of bit lines, and cell data are amplified by 128 and 128 sense amplifiers that are provided at upper and lower portions (in the bitline extend direction) respectively. The sense amps are designed to employ a shared sense-amp scheme, and are used in common for neighboring memory arrays. Similarly, the subword drivers SWD also are used in common or "commonized" for selection of subwordlines of neighboring memory arrays.

Although not specifically limited, a redundancy cell array similar to the regular cell arrays is provided. This redundancy array is designable to have 256 redundant wordlines and 256 pairs of redundant bit lines, such as those stated supra. In addition to the X-Y redundancy, regular subarrays have redundant bitlines although not specifically limited thereto. Thus, it is also possible to cure any bitline defects within the individual regular cell array.

An X address that was taken into the X address buffer is decoded by an X predecoder circuit; in tandem with this operation, the X address is compared by an address comparator circuit to a defective address being presently stored in an X-system fuse element (FUSE). An output signal of the X predecoder is supplied to an X decoder of the regular mat use and also to an X decoder for the redundant mat use. A Y address as taken into Y address buffer is compared by an address comparator circuit to a defective address being stored in a Y-system fuse (FUSE), followed by execution of determination as to which one of the regular and redundant mats is used, based on conformity or "agreement" information of the X-system defective address. By this determination result, operations of the X and Y decoder circuits are performed in a way corresponding to whether regular mat cure or redundant mat cure is to be done.

Figure 11:
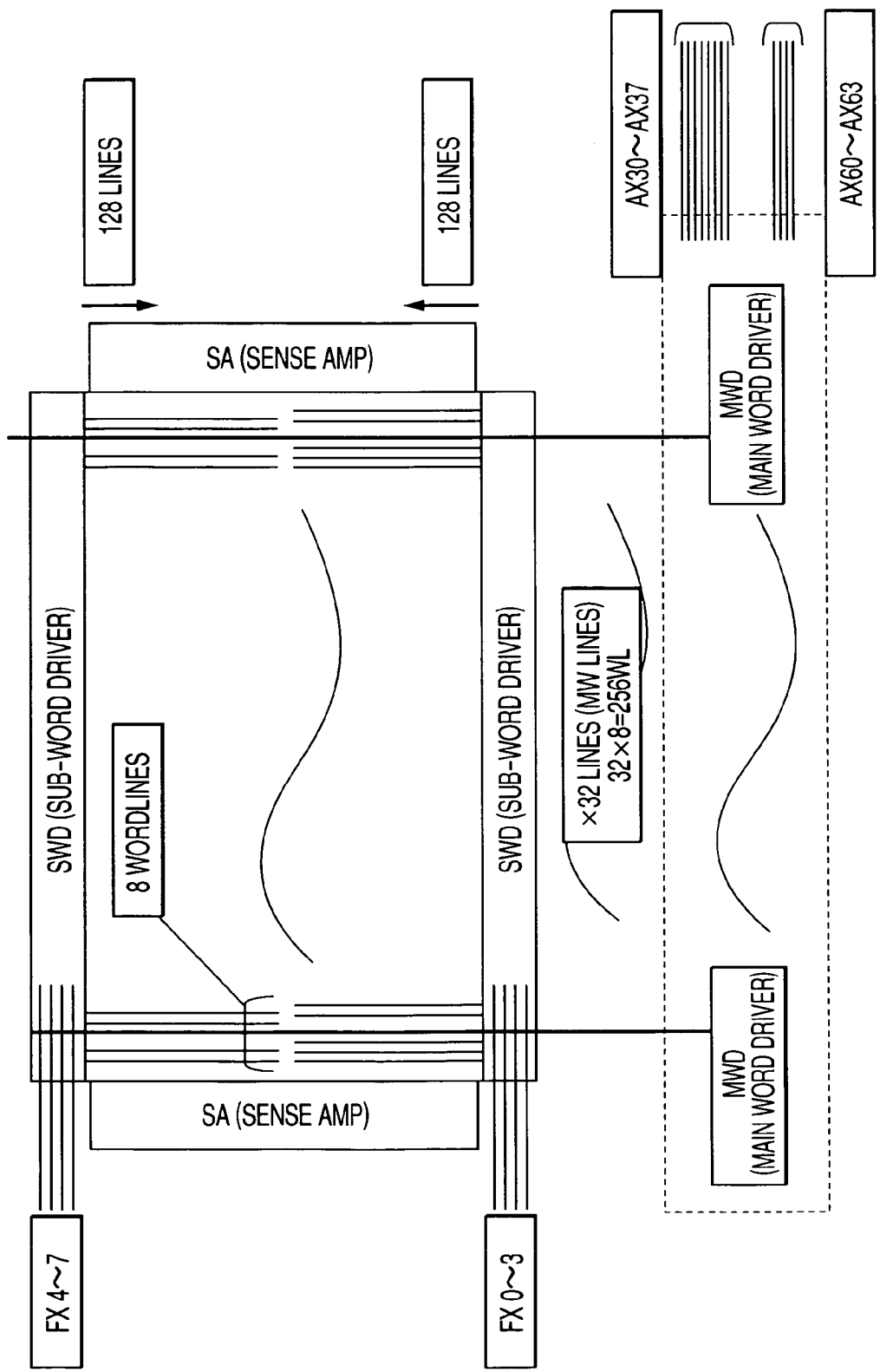
FIG. 11 is a block diagram showing one embodiment of a cell array (memory mat) of FIG. 10.

In FIG. 11, a block diagram of one embodiment of the cell array (memory mat) of FIG. 10 is shown. In FIG. 11, a wordline layout pattern is shown. A main word driver MWD generates a signal for selection of a main wordline which extends to penetrate a memory cell array that constitutes one memory bank corresponding to the driver. Cell arrays are formed to be surrounded by sense amplifiers SA and subword drivers SWD. A single cell array (subarray or memory mat) is associated with 256 subwordlines while using 256 pairs of complementary bitlines that extend at right angles thereto, although not specifically limited thereto.

Eight word lines (sub-wordlines) are assigned with respect to one main wordline. As 256 wordlines are provided in the cell array as stated previously, 32 (=256/8) main wordlines MWL are provided. A 8-bit predecode signal consisting of AX30 to AX37 and a 4-bit predecode signal consisting of AX60–AX64 are supplied to the main word drivers. Depending upon a possible combination thereof, one of the 32 main wordlines is selected by a main word driver MWD. Wordline select signals (subword select lines) FX0–FX7 are provided for selecting one from among every group of eight wordlines assigned per main wordline. To form the wordline select signals FX0–FX7, either a 3-bit X address signal or its decoded signal is used.

A subword driver SWD receives the main wordline select signal and the wordline select signal to select a single wordline (subwordline). As previously stated, a cell array is provided with 256 wordlines, and their corresponding 256 subword drivers are laid out dispersedly so that 128 drivers are on one side and 128 drivers are on the opposite side. The wordline select signals are input so that these also are divided into two groups such as FX0–3 and FX4–7. Eight subword drivers that are provided in a way corresponding to one main wordline are arranged so that four drivers SWD0–3 are disposed on one side to which the select signals FX0–3 are supplied whereas the remaining four ones SWD4–7 are on the other side to which the select signals FX4–7 are supplied.

In this embodiment, the wordlines provided in a cell array are shown to be cut at a central portion of the cell array. This does not intended to indicate that the wordlines are electrically disconnected at the center of the cell array. It is a mere simplified indication in order to emphasize that the wordlines (floating gate or "FG" layer) to which memory cells are connected are cut at their central portions for achievement of high speed performances and higher integration densities as will be described later.

Figure 12:
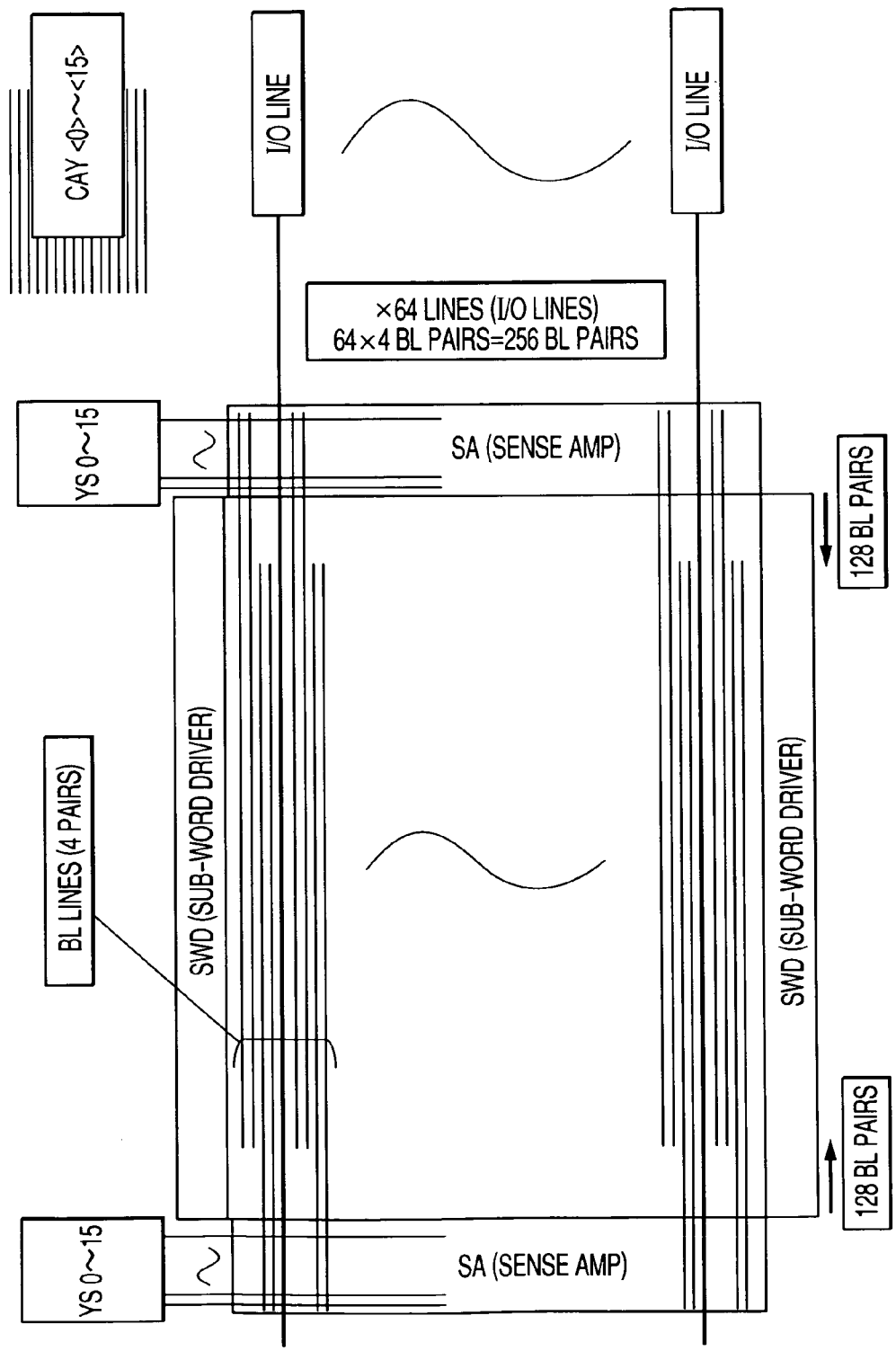
FIG. 12 is a block diagram showing one embodiment of the cell array (memory mat) of FIG. 10.

FIG. 12 shows a block diagram of one embodiment of the cell array (memory mat) of FIG. 10. In FIG. 12, a layout pattern of bitline pairs is shown. While the bitline pairs consist of 256 pairs, sense amplifiers SA are laid out dispersedly on the both side of the cell array in a way corresponding to the half of them, i.e., 128 pairs. In addition, 64 input/output (I/O) lines are extended in the bitline direction. One I/O line indicated by a heavy line segment consists of four pairs of signal lines for transmission of four pairs of bitline signals. Column select signals YS0 to YS15 are for selection of four I/O lines. More specifically, two I/O lines are selected by one sense amp SA, while two I/O lines are selected by the other sense amp SA. Since a single I/O line is made up of four pairs of signal lines, 16-bit signal input/output becomes possible as a whole. Signals CAY(0)–(15) are decode signals for forming the column select signals YS0–15.

In FIG. 12, bitlines BL are also segmented at a central portion of the cell array in order to realize high-speed performance and higher integration although any specific indication is omitted herein for purposes of avoiding complexity in illustration. A difference from the wordlines is that shared switches (or alternatively BL switches) are provided to thereby enable the bitlines to be disconnected in a sense of electricity also.

Figure 13:
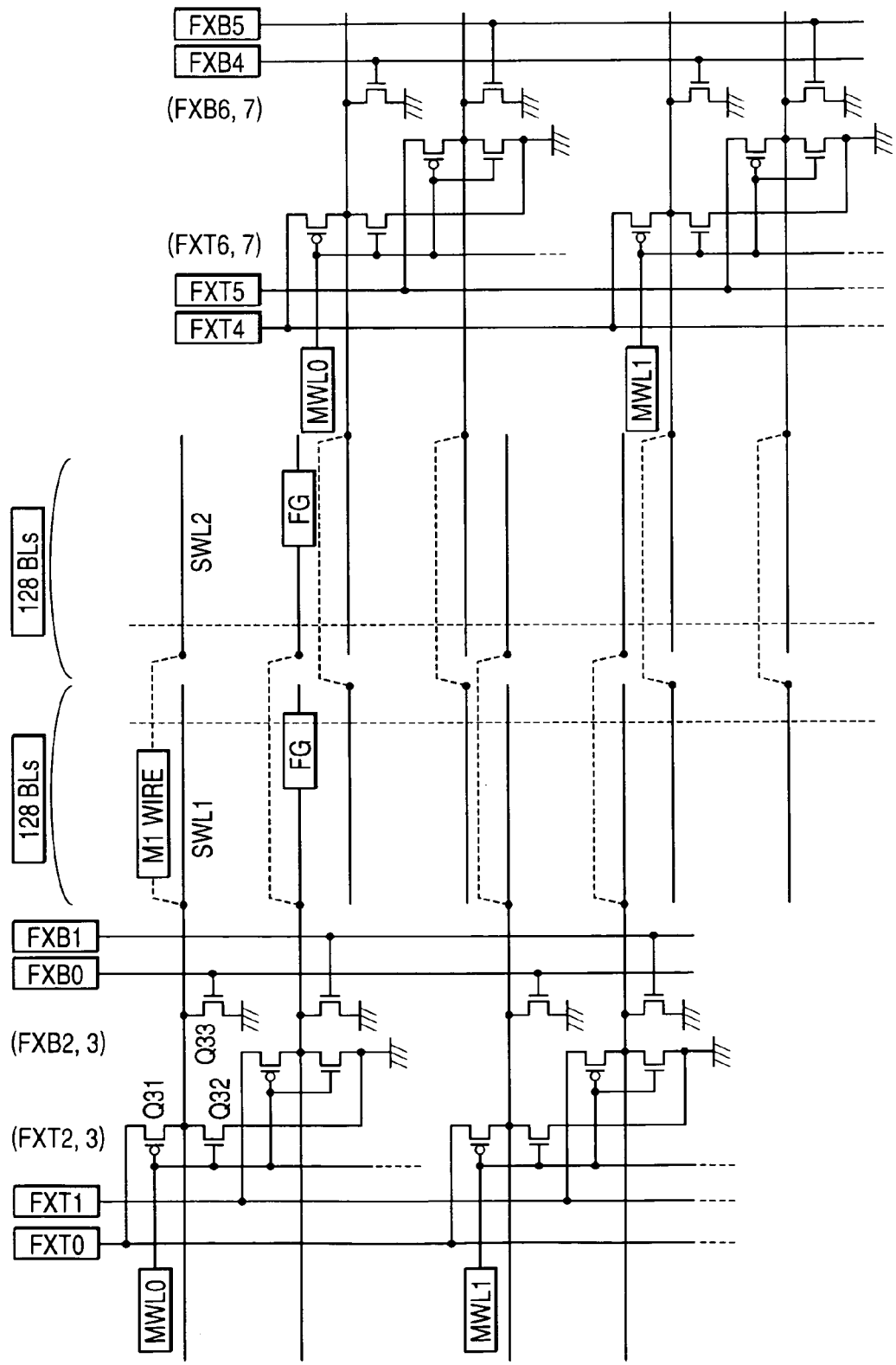
FIG. 13 is a circuit diagram showing one embodiment of a cell array (memory mat) of FIG. 11.

FIG. 13 shows a circuit diagram of one embodiment of the cell array (memory mat) of FIG. 11. Although main wordlines MWL0 and MWL1 are provided with sixteen subword drivers in total, that is, eight drivers are for one and eight drivers are for the other as stated supra, eight total subword drivers including four drivers corresponding to FX0,1 and four ones corresponding to FX4,5 are exemplarily shown in FIG. 13. An explanation will be given while exemplifying two of them, i.e., the subword drivers corresponding to the main wordlines MWL0–1 and select signal FX0, they are made up of MOSFETs Q30 to Q34. In FIG. 13, those transistors with gates to which symbols "○" are added to denote inversion are P-channel MOSFETs. The use of such symbol is aimed at distinction from N-channel MOSFETs.

The P-channel MOSFET Q30 and N-channel MOSFET Q31 make up a CMOS inverter circuit. The gates of MOSFETs Q30 and Q31 are connected to a main wordline MWL0. Similarly, the P-channel MOSFET Q32 and N-channel MOSFET Q33 constitute a CMOS inverter circuit. The gates of MOSFETs Q32 and Q33 are coupled to a main wordline MWL1. A wordline select signal FXT0 is supplied in common to the drains of P-channel MOSFETs Q30 and Q32 of the two subword drivers, i.e., operation voltage terminals of the CMOS inverter circuits.

An N-channel MOSFET Q34 is provided between output terminals of the above-noted two subword drivers, with a wordline select signal FXB0 being supplied to its gate. The other ones are similar in configuration—namely, three sets (six in total) of similar subword drivers are provided with respect to each of the wordline select signals FXT1, FX4, FX5 while letting the main wordlines MWL0–1 be made common in a similar way. The remaining eight subword drivers are eliminated from the illustration, which correspond to the wordline select signals FX2–3 and FX6–7.

An output terminal of the subword driver made up of MOSFETs Q30 and Q31 is connected to one end of a first subwordline SWL1 that is formed of an FG layer. This first subwordline SWL1 has the other end, which extends up to an intermediate portion of the cell array and terminates at this portion. Hence, although 256 pairs of bitlines BL are provided in the cell array as stated previously, the first subwordline SWL1 is disposed to cross the half of them, i.e., 128 pairs of bitlines. Accordingly, 128 memory cells are to be connected to the first subwordline SWL1.

The output terminal of the subword driver is extended in parallel to the first subwordline SWL1 and then connected to one end of an M1 wiring line. The other end of this M1 wire is connected to one end of a second subwordline SWL2, which is extended in the extending direction of the first subwordline SWL1. This second subwordline SWL2 is structured from an FG layer in a similar way to the first subwordline SWL1. The line SWL2 is laid out to extend from the intermediate portion of the cell array up to a cell array end portion on the opposite side of the subword driver and then cross the remaining half, 128 pairs of bitlines. Thus, 128 memory cells are connected to the second subwordline SWL1 also.

As the first subwordline SWL1 and the second subwordline SWL2 are connected together via the M1 wiring line, it is possible by a single subword driver to set 256 memory cells in the select state. However, since the M1 wire is designable to have a lower resistance value than that of the subwordline SWL1 formed of the FG layer, it is possible, by letting subword drivers have sufficiently large current drivability, to permit memory cells at the far end of subwordline SWL1 to be substantially equal in select delay time to those memory cells at the far end of subwordline SWL2.

In other words, when compared to a delay time consumed for selection of memory cells at the far end in case 256 memory cells are connected to a subwordline formed of an FG layer, it is possible, by division into two subwordlines SWL1 and SWL2 with 128 memory cells connected thereto, to shorten by half a delay time consumed for memory cell selection at respective far ends if the subword driver's output impedance is ignored.

When lessening to 128 the number of the subwordline-connected memory cells, it is possible to make faster the memory cell selection time in a similar way to the one stated supra. However, the cell array division number increases, resulting in a twofold increase in number of subword drivers to be provided in the wordline direction. Due to this, the overall area of memory cell arrays increases unintentionally. In this embodiment, higher integration is achievable since the subwordline-connected memory cells may be equivalently half reduced in number by cutting the FG layer-formed subwordlines at an intermediate portion of the cell array while arranging the subwordline SWL2 that is disposed far from the subword drivers in such a way as to transfer the subword driver's select signal via the M1 wiring line of low resistance, which is laid out in parallel to the subwordline SWL1 disposed in close proximity to the subword drivers.

A select operation of the subwordlines SWL1 and SWL2 is as follows. When the main wordline MWL0 is set in the select state that is low in potential with the wordline select signal FXT0 staying in the select state high in potential, the P-channel MOSFET Q30 turns on, causing the high level of the wordline select signal FXT0 to be sent to the subwordlines SWL1, SWL2. At a subword driver corresponding to the main wordline MWL1 that is presently in the nonselect state, the N-channel MOSFET Q33 turns on, causing the subwordline to be set at a nonselect level of low potential. At this time, the MOSFET Q34 is in the OFF state due to the low level of FXB0. When the wordline select signal FXT0 is in the select state of high level with the main wordline MWL0 being set at the high level of nonselect state and with the main wordline MWL1 being set at the low level of select state, the neighboring subwordline is selected.

When the main wordline MWL0 is set in the select state of low level with the wordline select signal FXT0 being in the nonselect state of low level, the P-channel MOSFET Q30 turns on. However, the threshold voltage of P-channel MOSFET Q30 remains at the wordline select signal FXT0 so that it is impossible to set at the low level such as ground potential. At this time, the MOSFET Q34 is in the ON state due to the high level of FXB0 whereby the low level that was formed when the N-channel MOSFET Q33 of the subword driver corresponding to the nonselected main wordline MWL1 is sent to the subwordlines SWL1 and SWL2. At this time the other subwordline is set in the select state by any one of the wordline select signals FX1 (FXT1, FXB1) to FX7 (FXT7, FXB7).

Figure 14:
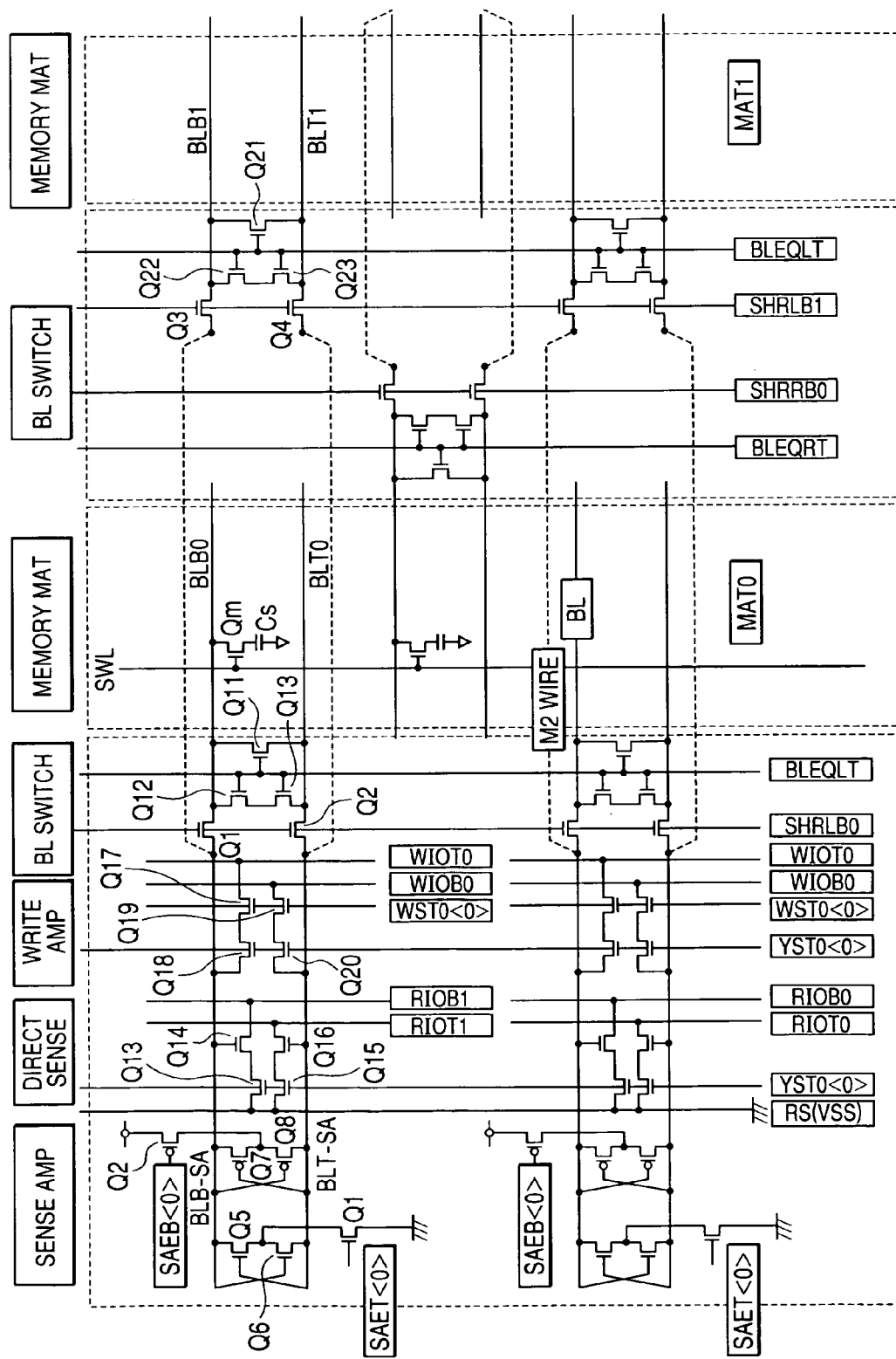
FIG. 14 is a circuit diagram showing one embodiment of a cell array (memory mat) of FIG. 12.

In FIG. 14, a circuit diagram of one embodiment of the cell array (memory mat) of FIG. 12 is shown. In this drawing, two representative sense amplifiers and their associated bitline pairs along with precharge circuits and read circuits plus write circuits are exemplarily depicted as representative ones. In this embodiment a memory array is divided into two memory mats MAT0, MAT1. As exemplarily shown in the memory mat MAT0, a dynamic type memory cell consists essentially of an address-selecting MOSFET Qm and a data storage capacitor Cs. The address selector MOSFET Qm has its gate which is connected to a subwordline SWL0 such as the one stated above. One source/drain region of this MOSFET Qm is connected to a bitline BLB0 of a bitline pair. The other source/drain is coupled to a storage node of the data storage capacitor Cs. The other electrode of storage capacitor Cs is commonized, to which a plate voltage is given.

As stated above, the memory cell array is divided into two memory mats MAT0 and MAT1, in which bitlines BLB0-BLT0 and BLB1-BLT1 are respectively disposed in parallel as shown in FIG. 14. The complementary bitlines BLB0 and BLT0 of the memory mat MAT0 as disposed adjacent to sense amplifiers are connected by shared switch (or BL switch) MOSFETs Q1 and Q2 to sense amp input/output nodes BLB-SA and BLT-SA, respectively. Shared switch (or BL switch) MOSFETs Q3 and Q4 which are provided at complementary bitlines BLB1 and BLT1 which are disposed far from the sense amps are connected via M2 wiring lines that extend in parallel to the above-noted complementary bitlines BLB0 and BLT0 to sense-amp input/output nodes BLB-SA and BLT-SA. To make a long story short, the memory cell array is divided into two memory mats MAT0 and MAT1 by the BL switch unit that is provided at the center in the bitline direction.

A unit circuit that constitutes a sense amplifier is formed of a CMOS latch circuit, which is made up of N-channel MOSFETs Q5–Q6 and P-channel MOSFETs Q7–Q8 with their gates and drains being cross-coupled to provide a latch form. The sources of the N-channel MOSFETs Q5–Q6 are provided with a sense-amp activating MOSFET Q1, to which ground potential is given. The sources of the P-channel MOSFETs Q7–Q8 are provided with a sense-amp activator MOSFET Q2, to which an operation voltage is applied.

A sense-amp activation signal SAEB is supplied to the gate of senseamp activator MOSFET Q2, which is driven to turn on in synchronism with the low level of a signal SAEP, causing the operation voltage to be given to the source of the P-channel MOSFET Q7, Q8. A senseamp activation signal SAET is supplied to the gate of the senseamp activator MOSFET Q1, which is turned on in a way synchronized with the high level of the signal SAET, allowing the ground potential of the circuitry to be given to the source of N-channel MOSFET Q5, Q6.

It is also permissible that the sources of the N-channel MOSFETs Q5 and Q6 are common-coupled to the sources of similar MOSFETs of another sense amplifier and that the sense-amp activator MOSFET Q1 is provided in common for a plurality of sense amps to enable supplement of the ground potential while letting the sources of P-channel MOSFETs Q7 and Q8 be common-coupled with the sources of similar MOSFETs of another sense amp to permit application of the operation voltage via the senseamp activator MOSFET Q2 as provided in common to multiple sense amps.

The sense amplifier's input/output nodes BLB-SA and BLT-SA are provided with a direct sense circuit making up the read circuit and a write amp circuit making up the write circuit. The direct sense circuit is configured from N-channel MOSFETs Q13 to Q16. The write amp circuit is formed of N-channel MOSFETs Q17–Q20.

The direct sense circuit is such that amplifying MOSFETs Q14, Q16 having gates connected to the input/output nodes BLB-SA and BLT-SA of the sense amplifier stated above and MOSFETs Q13 and Q14 with their gates connected to a column select line YST0<0> are series-connected respectively. The drain of the amplifying MOSFET Q14 is connected to a complementary read-use signal line RIOB1, whereas the drain of amplifier MOSFET Q16 is coupled to a read-use signal line RIOT1. The ground potential of circuitry is supplied to the sources of MOSFETs Q13 and Q15.

The write amp circuit is constituted from series circuits of MOSFET Q17–Q18 and MOSFET Q19–Q20 as provided between the sense-amp input/output nodes BLB-SA and BLT-SA on one hand and complementary write-use signal lines WIOB1 and WIOT1 on the other hand. The gates of MOSFETs Q18 and Q20 for use as column switches are connected to the column select line YST0. The gates of MOSFETs Q17 and Q19 are coupled to an operation timing signal line WST0<0>.

The sense amplifiers of this embodiment are designed as the so-called shared sense amps with two pairs of complementary bitlines of the right and left memory cell arrays being provided for a respective one of the input/output nodes BLB-SA and BLT-SA. More specifically, in a one-side memory cell array that is exemplarily shown in FIG. 14, the input/output nodes BLB-SA and BLT-SA are connected to the near-side bitlines BLB0 and BLT0 through the shared switch MOSFETs Q1 and Q2 while being connected to far-side bitlines BLB1 and BLT1 via the M2 wiring lines and shared switch MOSFETs Q3 and Q4, respectively.

In this embodiment, select signals SHRLB0 and SHRLB1 are applied to the gates of the shared switch MOSFETs Q1–Q2 and Q3–Q4. The select level of such select signals SHRLB0 and SHRLB1 is set at the high level such as a potentially raised or "boosted" voltage in the same way as the select level of subwordline SWL or else. Additionally a similar memory cell array is provided in the other sense amplifier. In addition, sense amps are disposed on the both sides of the memory cell array in the bitline direction. Neighboring ones of the bitlines BLB0, BLT0 and BLB1, BLT1 are connected to sense amps, not shown, which are next to the memory mat MAT1.

The one complementary bitline BLB0, BLT0 is provided with a precharge circuit made up of switch MOSFETs Q12 and Q13 which supply a half-precharge voltage, not shown, and a MOSFET Q11 for short-circuit of BLB0, BLT0. A precharge signal BLEQLT is supplied in common to the gates of these MOSFETs Q11–Q13. For the other complementary bitlines BLB1, BLT1, a precharge circuit is provided which is made up of switch MOSFETs Q22 and Q23 which supply the half-precharge voltage, not shown, and a MOSFET Q21 for shorting bitlines BLB1, BLT1 together. A precharge signal BLEQLT is supplied in common to the gates of these MOSFETs Q21–Q23.

When MAT0 of the memory cell array is selected, the MOSFETs Q1 and Q2 maintain the ON state upon receipt of the signal SHRLB0, causing the signal SHRLB1 to be set at low level, followed by execution of disconnection of the bitlines BLB1, BLT1 of memory mat MAT1. The other memory cell array's bitlines are disconnected in a similar way. When the memory mat MAT1 is selected, the MOSFETs Q3 and Q4 retain the ON state upon receipt of the signal SHRLB1, setting the signal SHRLB0 at low level, resulting in execution of disconnection of the memory mat MAT0's bitlines BLB0, BLT1. Within a precharge period with memory access completed, both the signals SHRLB0-SHRLB1 and a signal(s) corresponding to the other memory cell array are set together at high level. In this precharge period, bitline precharge is performed in response to the signal BLEQLT.

In this embodiment, the bitline to be connected at the time of amplification by a sense amplifier is only either one of the bitlines BLB0, BLT0 or BLB1, BLT1 in a memory cell array that is selected by the above-noted select operation. As a result, it is possible to reduce by half the number of memory cells being connected to a selected bitline in such a manner that the resultant cell number is lessened from 256 to 128. Owing to this, the bitline parasitic capacitance decreases in value. Thus it is possible to make smaller the capacitance ratio of it to the storage capacitor Cs of a memory cell. In other words, it is possible to enlarge the amount of a change with respect to the precharge potential of a bitline corresponding to data charge of the storage capacitor Cs. Whereby, the amount of a signal to be input to a sense amp increases, thereby enabling enhancement of high-speed performance of the sense amp while at the same time reducing power consumption thereof.

Lessening to 128 the number of bitline-connected memory cells makes it possible to achieve high-speed performance and low power consumption of sense amplifiers in a similar way to that stated above. However, the cell array division number increases, resulting in a twofold increase in number of sense amps as provided in the bitline direction. This leads to an increase in overall memory cell array area. In this embodiment, higher integration is achievable because the number of senseamp-connected memory cells may be half-reduced by cutting the BL layer-formed bitlines at an intermediate portion of the cell array while connecting those bitlines that are disposed far from the sense amps to the sense amps by M2 wiring lines of low resistance, which are laid out in parallel to the bitlines disposed near the sense amps.

Applying the subword drivers embodying the invention to DRAM units such as those stated above makes it possible to reduce the area of such DRAM units. And, the use of the symmetrical layout of MOSFETs making up the subword drivers results in a decrease in deviation of MOSFET operation characteristics, which reduces the irregularity of wordline select timings to thereby enable achievement of high-speed performances. The MOSFET area reduction contributes to production cost reduction due to chip area shrinkage. In addition, the operation characteristics of circuitry are improved in stability, which advantageously facilitates optimization of operation margins.

Although the invention made by the present inventor(s) has been explained in detail based on the embodiments thereof, this invention should not exclusively be limited to such embodiments and may be modified and altered in various ways without departing from the scope of the invention. For example, the circuitry of FIG. 1 may be used as a logic gate circuit in addition to the wordline selector circuit such as the subword driver. More specifically, it may be designed to operate as a logic gate with an input of CMOS inverter circuit as a first input terminal and with an operating voltage terminal as a second input terminal. The CMOS circuit may be the one that configures circuitry while letting the gate of N-channel MOSFET exhibit a rectangular ring-like shape and also letting the gate of P-channel MOSFET have a "]"-like shape. This invention is widely utilizable for various types of semiconductor integrated circuit devices having logic gate circuitry with one of input terminals being commonized, in addition to the one that has memory circuitry such as the DRAM stated supra.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor integrated circuit device comprising a plurality of first circuits each being such that a gate of a MOSFET of first conductivity type and a gate of a MOSFET of second conductivity type are commonly connected together for use as a first input terminal, a source of the first conductivity type MOSFET is for use as a second input terminal, a ground potential of circuitry is given to a source of the second conductivity type MOSFET, and a drain of the first conductivity type MOSFET and a drain of the second conductivity type MOSFET are common-connected together for use as an output terminal, wherein
said first conductivity type MOSFET is such that one gate electrode has a rectangular shape whereas said second conductivity type MOSFET is such that two adjacent gate electrodes exhibit a rectangular shape while letting these rectangular gate electrodes be laid out so that pitches thereof are equal to each other, and
first input terminals of the plurality of first circuits are mutually connected by a wiring layer forming the gate electrodes.

2. The semiconductor integrated circuit device according to claim 1, wherein the first conductivity type is P channel type whereas the second conductivity type is N channel type.

3. The semiconductor integrated circuit device according to claim 2, wherein two MOSFETs having two rectangular gate electrodes are separated by an isolation area with respective active regions being provided at an intermediate portion thereof, and wherein each gate electrode has a square bracket-like shape.

4. The semiconductor integrated circuit device according to claim 3, wherein each of the first circuits is such that the output terminal is connected to a sub-word line, the first input terminal is coupled to a main word line, and the second input terminal is coupled to a sub-word line select line, thereby functioning as a sub-word driver,
the sub-word line is provided with a plurality of bit lines intersecting it, and
a memory cell is disposed at each intersection point of the sub-word line and each of the plurality of the bit lines.

5. The semiconductor integrated circuit device according to claim 4, wherein
the main word line is associated with a plurality of sub-arrays arranged along an extension direction thereof,
sub-word drivers are provided on both sides of the sub-array, and the sub-word drivers are such that each driver performs a select operation of sub-word lines of sub arrays as provided on both sides with the driver being as a center.

6. The semiconductor integrated circuit device according to claim 4, wherein the sub-word drivers are such that those corresponding to four sub-word lines are treated as one set, common-coupled first input terminals of the one set of sub-word drivers are connected to a main word line, and second input terminals of the one set of sub-word drivers are connected to a sub-word line select line corresponding to respective sub-word lines.

7. The semiconductor integrated circuit device according to claim 6, wherein four P-channel MOSFETs are serially arranged in the word line extension direction at a central portion of a sub-word driver area, two N-channel MOSFETs are disposed respectively on both sides of each of the serially arranged four P-channel MOSFETs, and the N-channel MOSFETs are formed in the same well region as memory cells of the sub-arrays.

8. The semiconductor integrated circuit device according to claim 7, wherein contact portions for connecting the commonized gates of the P-channel MOSFETs and N-channel MOSFETs and the main word line are disposed above a well isolation area for isolation between a well region in which the P-channel MOSFETs are formed and a well region in which the N-channel MOSFETs are formed.

9. The semiconductor integrated circuit device according to claim 6, wherein gate draw-out portions for mutual connection of the gate electrodes of the MOSFETs are arranged to become mutually symmetrical in a relationship with drain-connected contacts.

10. The semiconductor integrated circuit device according to claim 9, wherein contacts of the drains of the serially arranged four p-channel MOSFETs and four N-channel MOSFETs are disposed to line up on four straight lines respectively, and on the four straight lines, an output wiring line is formed for connecting together the sub-word driver and a sub-word line corresponding thereto.

* * * * *